(12) United States Patent
Ge

(10) Patent No.: US 11,410,025 B2
(45) Date of Patent: Aug. 9, 2022

(54) IMPLEMENTING A MULTI-LAYER NEURAL NETWORK USING CROSSBAR ARRAY

(71) Applicant: TETRAMEM INC., Newark, CA (US)

(72) Inventor: Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 1007 days.

(21) Appl. No.: 16/125,454

(22) Filed: Sep. 7, 2018

(65) Prior Publication Data

US 2020/0082252 A1   Mar. 12, 2020

(51) Int. Cl.
  *G11C 5/02*  (2006.01)
  *G06N 3/063* (2006.01)
  *G06N 3/04*  (2006.01)

(52) U.S. Cl.
  CPC .............. *G06N 3/063* (2013.01); *G06N 3/04* (2013.01); *G11C 5/02* (2013.01)

(58) Field of Classification Search
  CPC ........ G06N 3/04; G06N 3/0635; G06N 3/063; G06N 7/005; G11C 5/02; G11C 5/06; G06F 13/00
  See application file for complete search history.

(56) References Cited

U.S. PATENT DOCUMENTS

| | | | | |
|---|---|---|---|---|
| 9,432,298 | B1 * | 8/2016 | Smith | H04L 47/34 |
| 10,459,724 | B2 * | 10/2019 | Yu | G11C 13/003 |
| 10,489,483 | B1 * | 11/2019 | Marinella | G06F 17/16 |
| 10,776,684 | B1 * | 9/2020 | Agarwal | G06N 3/0635 |
| 11,055,610 | B2 * | 7/2021 | Li | G06F 17/16 |
| 11,114,158 | B1 * | 9/2021 | Ge | G11C 11/1673 |
| 2008/0147954 | A1 * | 6/2008 | Mouttet | G06F 7/607 710/317 |
| 2012/0236623 | A1 * | 9/2012 | Qureshi | G11C 13/0061 365/148 |
| 2014/0016396 | A1 * | 1/2014 | Mazumder | G11C 13/004 365/148 |
| 2014/0172937 | A1 * | 6/2014 | Linderman | G06G 7/16 708/607 |
| 2015/0186258 | A1 * | 7/2015 | Edelhaeuser | G06F 12/0238 711/103 |
| 2015/0213884 | A1 * | 7/2015 | Taha | G11C 13/0069 365/148 |
| 2017/0178725 | A1 * | 6/2017 | Yang | G11C 13/003 |

(Continued)

*Primary Examiner* — Jaehwan Oh
(74) *Attorney, Agent, or Firm* — Jaffery Watson Mendonsa & Hamilton LLP

(57) ABSTRACT

Systems and methods for implementing a multi-layer neural network using crossbar arrays are disclosed. In some implementations, an apparatus comprises: a plurality of first devices, a plurality of second devices, and a plurality of first flow controllers connecting the plurality of first devices and the plurality of second devices. Each flow controller in the plurality of first flow controllers is independently controlled from other flow controller in the plurality of first flow controllers. In some implementations, the apparatus further comprises: a plurality of third devices; a plurality of second flow controllers connecting the plurality of second devices and the plurality of third devices; and a first common ground line separating the plurality of first flow controllers and the plurality of second flow controllers. Each of the plurality of second flow controllers is independent of each of the plurality of first flow controllers.

16 Claims, 15 Drawing Sheets

(56) References Cited

U.S. PATENT DOCUMENTS

2017/0221560 A1\* 8/2017 Hu .......................... G06G 7/122
2018/0253643 A1\* 9/2018 Buchanan .......... G11C 13/0069
2018/0321942 A1\* 11/2018 Yu ............................ G06F 7/00

\* cited by examiner

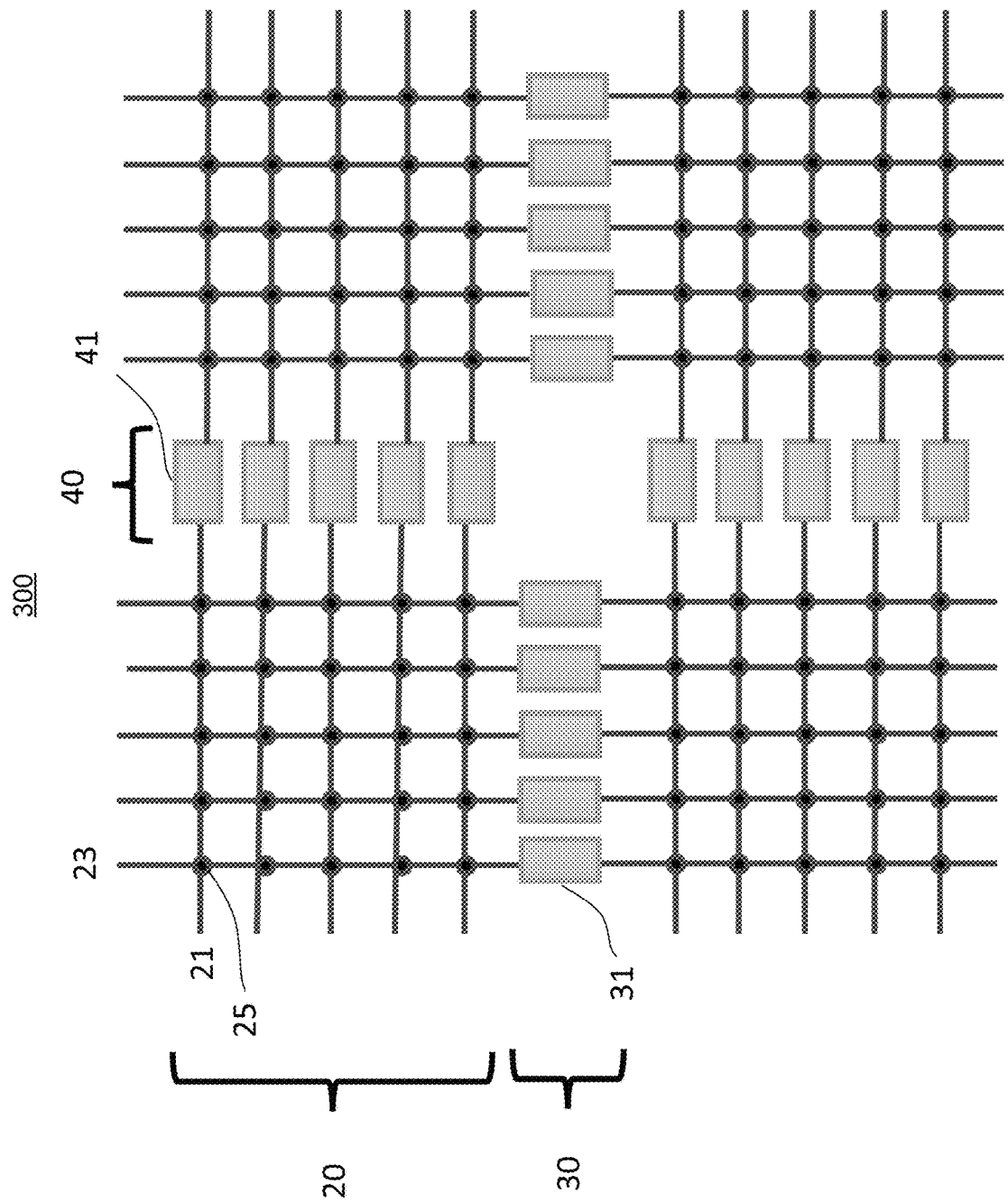

1200

1202

Prepare an input signal to an apparatus.

1204

A plurality of first devices, a plurality of second devices, a plurality of third devices, a plurality of fourth devices, a plurality of first flow controllers connecting the plurality of first devices and the plurality of second devices, a plurality of second flow controllers connecting the plurality of second devices and the plurality of third devices, and a plurality of third flow controllers connecting the plurality of the third devices and the plurality of the fourth devices.

1206

Select one flow controller in the plurality of second flow controllers as a selected second flow controller.

1208

Turn to ON state of one of the plurality of second devices and one of the pluralities of third devices that are in two ends of the selected second flow controller.

1210

Program the selected second flow controller.
The plurality of second devices and the plurality of third devices are row-wise devices.

FIG. 12

IMPLEMENTING A MULTI-LAYER NEURAL NETWORK USING CROSSBAR ARRAY

TECHNICAL FIELD

The present disclosure generally to crossbar arrays and more specifically relates to implementing a multi-layer neural network using one or more crossbar arrays.

BACKGROUND

A high performance neural network usually includes deep and wide neural layers, the implementation of which involves a good amount of large-scale matrix multiplications in a sequence. A crossbar array may include horizontal metal wire rows and vertical metal wire columns (or other electrodes) intersecting with each other, with cross-point devices formed at the intersecting points. A single crossbar array, however, may produce a single vector matrix multiplication.

Implementing a multi-layer neural network that involves large-scale matrix multiplications, therefore, remains a technical challenge.

SUMMARY

An apparatus comprises: a plurality of first devices; a plurality of second devices; and a plurality of first flow controllers connecting the plurality of first devices and the plurality of second devices, wherein each of the plurality of first flow controllers is independent of other of the plurality of first flow controllers.

In some implementations, one of the plurality of first devices and/or one of the plurality of second devices is one of: a memristor device, a memristive device, a floating gate, a Phase Change Random Access Memory (PCRAM) device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance.

In some implementations, the apparatus further comprises: a plurality of third devices; a plurality of second flow controllers connecting the plurality of second devices and the plurality of third devices; and a first common ground line separating the plurality of first flow controllers and the plurality of second flow controllers, wherein each of the plurality of second flow controllers is independent of each of the plurality of first flow controllers.

In some implementations, the apparatus further comprises: a plurality of fourth devices; a plurality of third flow controllers connecting the plurality of the third devices and the plurality of the fourth devices; and a second common ground line separating the plurality of the second flow controllers and the plurality of the third flow controllers, wherein each of the plurality of third flow controllers is independent of each of the plurality of second flow controllers.

In some implementations, the apparatus further comprises: a plurality of first metal layers; a plurality of second metal layers; and a signal source connecting to the plurality of first metal layers and the plurality of second metal layers, wherein of the plurality of first metal layers and the plurality of second metal layers are formed in two ends of the plurality of second flow controllers.

A method comprises: preparing an input signal to an apparatus having a plurality of first devices, a plurality of second devices, a plurality of third devices, a plurality of fourth devices, a plurality of first flow controllers connecting the plurality of first devices and the plurality of second devices, a plurality of second flow controllers connecting the plurality of second devices and the plurality of third devices, and a plurality of third flow controllers connecting the plurality of the third devices and the plurality of the fourth devices; selecting one of the plurality of the second flow controllers as a selected second flow controller; turning to ON state of one of plurality of second devices and one of the plurality of third devices that are in two ends of the selected second flow controller; and programming the selected second flow controller, wherein the plurality of second devices and the plurality of third devices are row-wise devices.

A method comprises: preparing an input signal to an apparatus having a plurality of first devices, a plurality of second devices, a plurality of third devices, a plurality of fourth devices, a plurality of first flow controllers connecting the plurality of first devices and the plurality of second devices, a plurality of second flow controllers connecting the plurality of second devices and the plurality of third devices, and a plurality of third flow controllers connecting the plurality of the third devices and the plurality of the fourth devices; selecting one of the plurality of the second flow controllers as a selected second flow controller; turning to ON state of one of plurality of second devices and one of the plurality of third devices that are in two ends of the selected second flow controller; turning to OFF state of other of plurality of second devices that are on same column of the one of plurality of second devices; turning to OFF state of other of plurality of third devices that are on same column of the one of plurality of third devices; and programming the selected second flow controller, wherein the plurality of second devices and the plurality of third devices are column-wise devices.

An apparatus comprises: a plurality of first devices; a plurality of second devices; a plurality of third devices; a plurality of fourth devices; a plurality of first flow controllers connecting the plurality of first devices and the plurality of second devices; a plurality of second flow controllers connecting the plurality of second devices and the plurality of third devices; a plurality of third flow controllers connecting the plurality of third devices and the plurality of fourth devices; and a plurality of fourth flow controllers connecting the plurality of fourth devices and the plurality of first devices, wherein each of the plurality of first flow controllers, the plurality of second flow controllers, the plurality of third flow controllers, and the plurality of fourth flow controllers is independent of others.

In some implementations, the apparatus further comprises: a first common ground line; and a second common ground line, wherein the first common ground line separates the plurality of second flow controllers and the plurality of third flow controllers, and/or the plurality of third flow controllers and the plurality of fourth flow controllers.

In some implementations, the second common ground line separates the plurality of second flow controllers and the plurality of third flow controllers, and/or the plurality of first flow controllers and the plurality of fourth flow controllers.

BRIEF DESCRIPTION OF THE DRAWINGS

FIG. 3A is a block diagram illustrating an example multi-layer neural network implemented using crossbar array circuits in accordance with some implementations.

FIG. 12 is a flowchart illustrating an example method for implementing a multi-layer neural network using crossbar arrays in accordance with some implementations.

The implementations disclosed herein are illustrated by way of example, and not by way of limitation, in the figures of the accompanying drawings. Like reference numerals refer to corresponding parts throughout the drawings.

DETAILED DESCRIPTION

Systems and methods may implement high performance and high efficiency multi-layer neural networks using one or more crossbar arrays. The technologies described in the present disclosure may provide the following technical advantages. First, programming signals for controlling flow controllers within a crossbar and programming signals for controlling cross-point devices may have different signaling thresholds, reducing disturbance and interference between flow controllers and cross-point devices. Second, programming signals for flow controllers may be individually programmed and thus independent from each other, enabling a more compact connection of multiple crossbar arrays and may dramatically improve power efficiency and circuit speed. Third, neural networks that require a shortcut route, such as the Residual Network (ResNet), may become able to be implemented using crossbar arrays.

Figure 1:
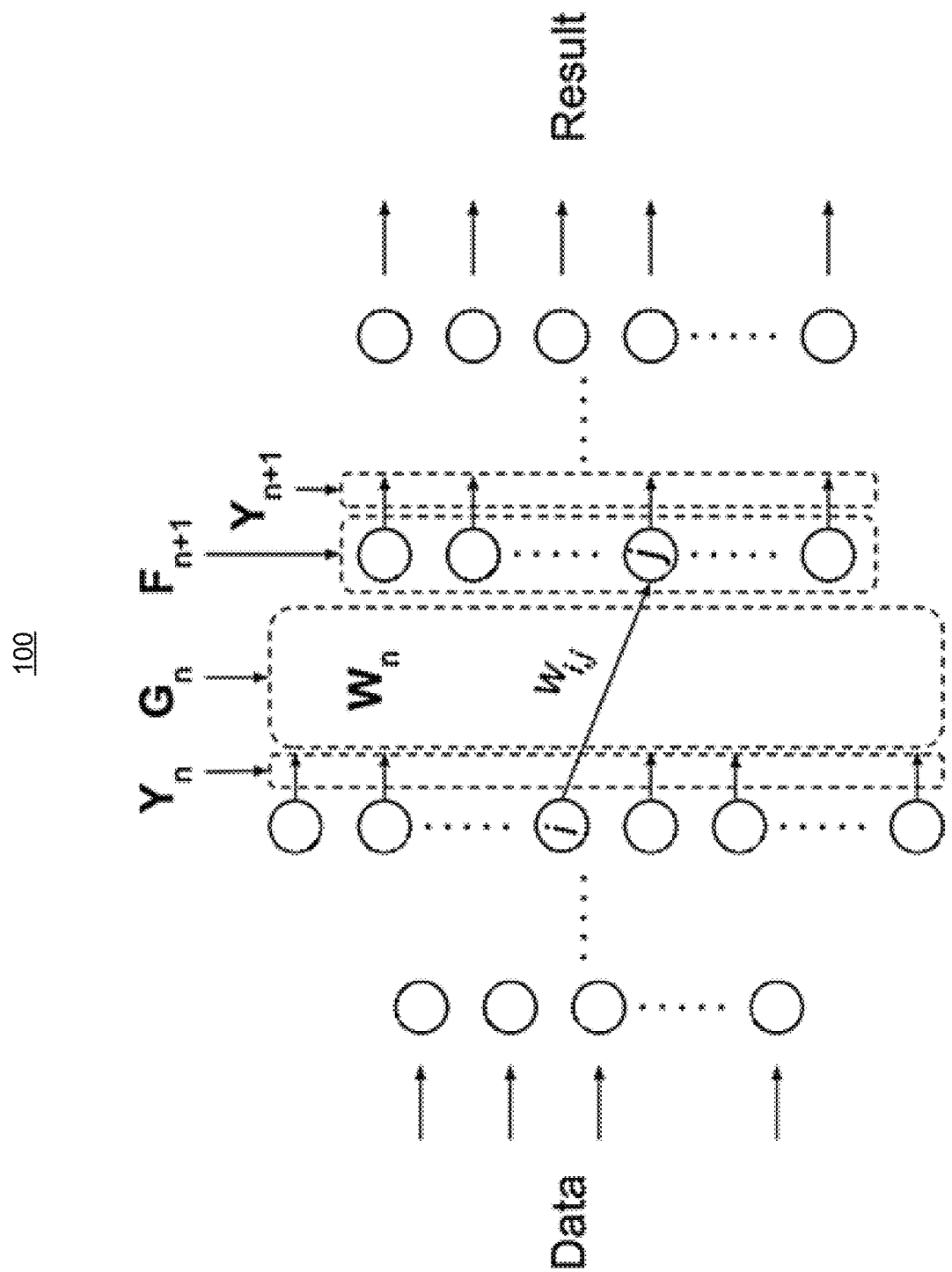
FIG. 1 is a block diagram illustrating an example neural network.

FIG. 1 is a block diagram illustrating an example neural network 100. Neural networks, such as the neural network 100 shown in FIG. 1, usually contain multiple layers. In some implementations, data flow in from the left-most layer (e.g., the input layer), and the result comes out from the right-most layer (e.g., the output layer), where each layer may involve a computation similar to the following:

$$Y_{n+1} = F_n(G_n(W_n, Y_n))$$

Here, $Y_n$ represents the output matrix of the n-th layer, $W_n$ represents the weight matrix of the n-th layer that $w_{i,j}$ represents the weight between the i-th output from the n-th layer and the j-th input to the (n+1)-th layer. $G_n$ represents the function that describes how $Y_n$ calculates with $W_n$ at the n-th layer: in fully connected layers, $G_n$ may be a matrix product $Y_n W_n$; and in convolution layers, $G_n$ may be the convolution operation $Y_n * W_n$. $F_n$ represents the function that describes how output of $G_n$ is being processed at the n-th layer. A neural network's computation complexity may be dominated by G, because since G involves large-scale matrix multiplications (convolution may be transformed into matrix multiplication as well).

$F_n$ may be a linear function, such as when $F_n = a * G_n + b$ or a nonlinear function, such as a Softmax function, a Rectified Linear Unit (ReLU) function, a pooling function, a batch normalization function. $F_n$ may also be a combination of both a linear function and a nonlinear function. The present disclosure provides example implementations of a linear $F_n$ function and a nonlinear $F_n$ function. More complex $F_n$ functions may be formed by connecting one or more circuit units implementing different or same $F_n$ functions in serial or in parallel.

Figure 2:
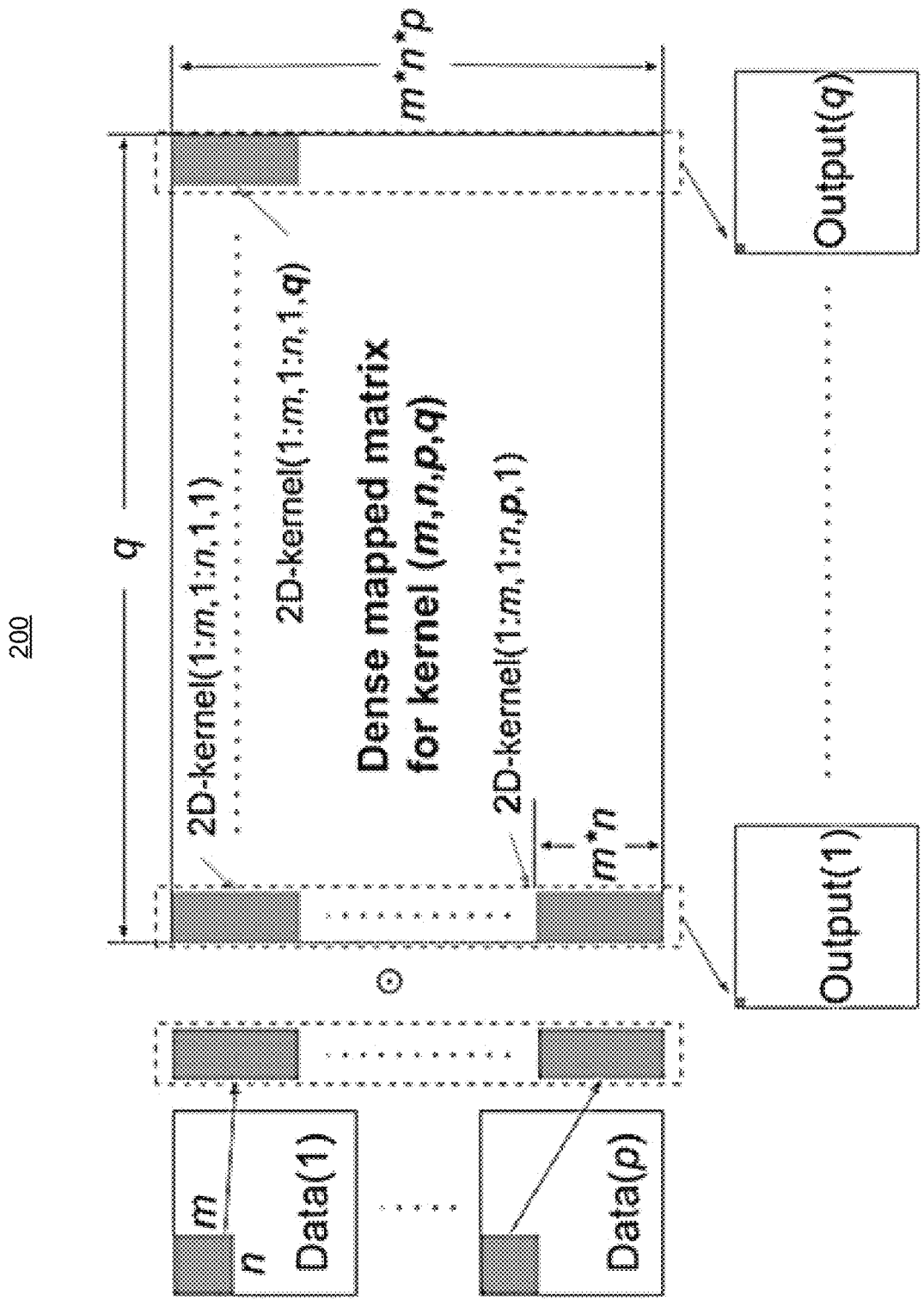
FIG. 2 is a block diagram illustrating an example conversion from a 4D convolution to a 2D dense matrix multiplication.

FIG. 2 is a block diagram illustrating an example conversion 200 from a 4D convolution to a 2D dense matrix multiplication. 4D-convolution is a frequently used type of convolution for neural networks for processing images. $G_n$ may be convolution.

The example conversion 200 may be implemented using a crossbar array. Each 2D kernel is unrolled to a vector and mapped to the column of crossbar so that one crossbar may implement multiple 2-D kernels as long as the crossbar has an enough number of columns. For input signal, only data within the convolution window is converted to the row inputs of crossbar arrays. For data with multiple channels, 2-D kernels for different channels are stacked into the same column, as input from different channels may be supplied to different rows and weighted summed together. An input shift register stores the input data within convolution at the current iteration and updates its storage as the window moves through the entire data space. The convolution result for data within the convolution window is collected at the column outputs of the crossbar. In this way, a single memristor-based convolution kernel needs j*k iterations for input data with size (j, k, p), where j, k, p represent data height, width, and channel, respectively.

FIG. 3A is a block diagram illustrating an example multi-layer neural network 300 implemented using crossbar array circuits in accordance with some implementations.

As shown in FIG. 3A, a crossbar array circuit 10 includes a tiled crossbar array 20, a first flow controller array 30, and a second flow controller array 40. The tiled crossbar array 20 includes a row wire 21, a column wire 23, and a cross-point device 25 connecting between the row wire 21 and the column wire 23. The first flow controller array 30 includes a first flow controller 31; the second flow controller array 40 includes a second flow controller 41.

Control signal flows within the tiled crossbar array 2 may be generated by switching the ON/OFF states of the flow controllers (e.g., the first flow controller 31 and the second flow controller 41) within the flow controller arrays 30 and 40.

Figure 3C:
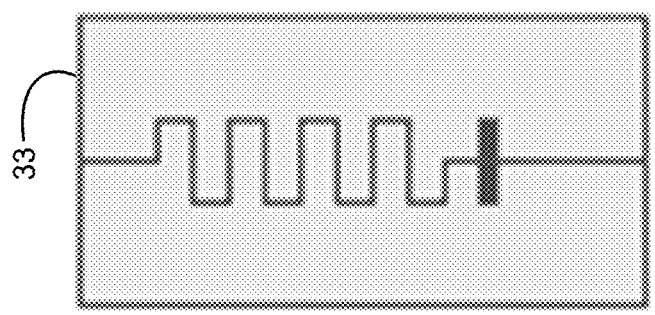
FIGS. 3B and 3C are block diagram illustrating two examples flow controllers in accordance with some implementations.
Figure 3B:
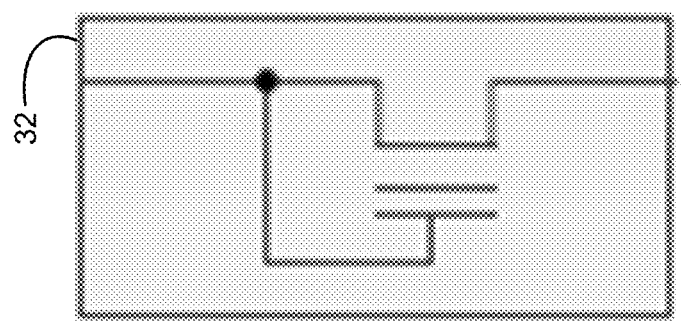

FIG. 3B and FIG. 3C show block diagrams illustrating two examples flow controllers 32, 33 in accordance with some implementations. In some implementations, the flow controllers may be floating gates such as the flow controller 32 shown in FIG. 3B, or memristors such as the flow controller 33 shown in FIG. 3C. In other implementations, the flow controllers may be neurons, or other two-terminal programmable devices/circuits with required linear or non-linear behavior, similar to $G_n$.

In some implementations, a cross-point device may be one of: a memristor device, a memristive device, a floating gate, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with tunable resistance. In some implementations, the cross-point device may be 1-Transistor-1-Resistor (1T1R), 1-Selector-1-Resistor (1S1R), or 2-Resistor (2R) structure. In some implementations, the conductance of the cross-point device may be tuned by applying a large enough voltage or current signal across the cross-point device. In some implementations, the row wires, column wires, or both, are metal wires.

In the implementations that include a 1T1R structure, a RRAM may be a two-terminal non-volatile memory device based on resistance switching effects. An example device may include a RRAM, an STT-MRAM, a PCRAM, or any cross-point device with tunable resistance. In some implementations, a transistor may be a semiconductor device configured to amplify or switch electronic signals and electrical power on and off. A transistor may have at least three terminals for connecting to an external circuit. A transistor in the embodiments of the present disclosure includes a Bipolar Junction Transistor (BJT), a Field-Effect Transistor (FET), a High Electron Mobility Transistor (HEMT), a TaOx device, a TiOx device, a HfOx device, a FeOx device, and any devices with different switching material.

Two-Tile Crossbar Array

Figure 4:
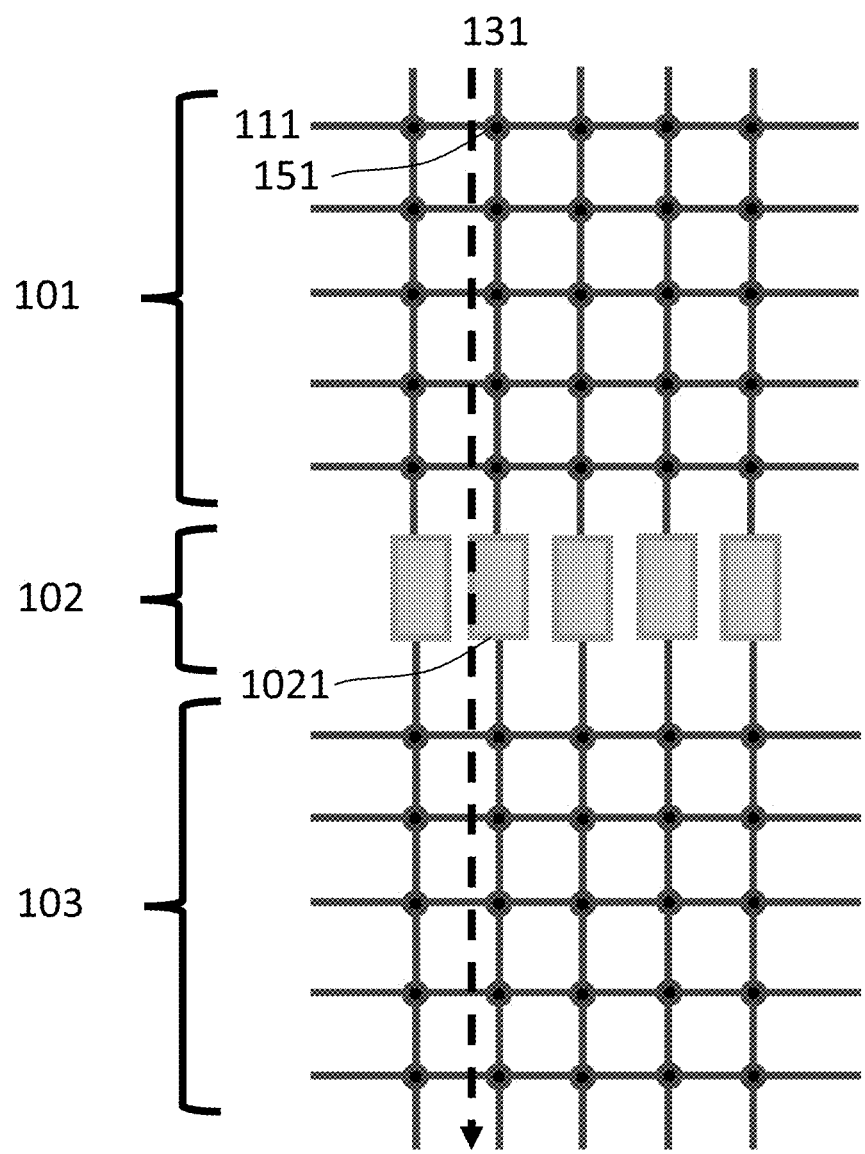
FIG. 4 is a block diagram illustrating an example two-tile crossbar array in accordance with some implementations.

FIG. 4 is a block diagram illustrating an example two-tile crossbar array 400 in accordance with some implementations.

As shown in FIG. 4, the two-tile crossbar array 400 includes a first tile crossbar array 101, a second tile crossbar array 103, and a flow controller array 102 connecting the first tile crossbar array 101 with the second tile crossbar array 103. The first tile crossbar array 101 includes a row wire 111, a column wire 131, and a cross-point device 151 connecting the row wire 111 and the column wire 131.

To reduce disturbance between the cross-point devices (e.g., the cross-point device 151) and flow controllers (e.g., the flow controller 1021) within the two-tile crossbar array 100, the following two technical solutions may be implemented.

First, the flow controllers are threshold programmed. In one example implementation, a sharp switching voltage or current is applied to flow controllers; as a result, cross-point devices that are analog-tuned would not be accidentally programmed by such programming signals applied to the flow controllers. In one example implementation, programming signals applied to flow controllers are significantly higher than those applied to cross-point devices, reducing potential interference with the cross-point devices.

Second, programming signals for flow controllers are independent for each flow controller so that each flow controller may be individually programmed, and the programming signal path should be passing through the intended flow controller and only the intended flow controller.

Three-Tile Crossbar Array

Figure 5:
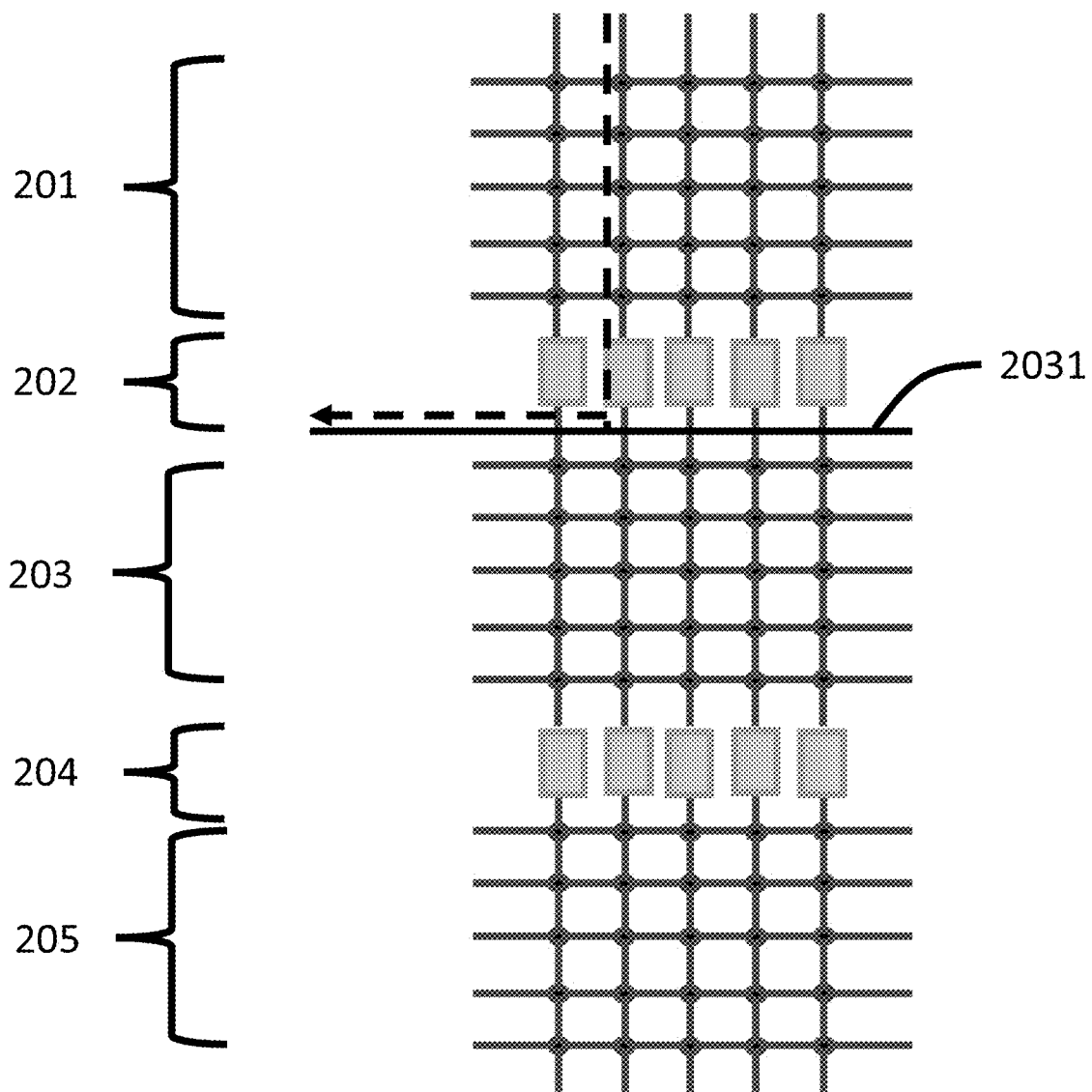
FIG. 5 is a block diagram illustrating an example three-tile crossbar array in accordance with some implementations.

FIG. 5 is a block diagram illustrating an example three-tile crossbar array 500 in accordance with some implementations.

FIG. 5 shows a three-tile crossbar array 500. The three-tile crossbar array 500 includes a first tile crossbar array 201, a second tile crossbar array 203, a third tile crossbar array 205, a first flow controller array 202, a second flow controller array 204, and a common ground line 2031 such that the first flow controller array 202 and the second flow controller array 204 are separated by the common ground line 2031. In some implementations, the common ground line 2031 is specially designed to electrically isolate the first flow controller array 202 and the second flow controller array 204 and to achieve the advantage of independently programming of two different sets of flow controller array.

Before discussing a four-tile row-wise crossbar array and a four-tile column-wise crossbar array, a more general case of crossbar array should be noted first. If the crossbar array does not have an access transistor in the cross-point device, then there is no difference between row-wise and column-wise embodiments. The solution works for the cross-point device without access transistor is the column-wise solution, which needs pre-programming of the cross-point devices on the same column. If the four-tile crossbar array is 1T1R, which has the access transistor for a better control at each cross-point device, then the row-wise and the column-wise solutions are different according to whether the access transistor control line is shared by row or by column. The following are embodiments of a four-tile row-wise crossbar array and a four-tile column-wise crossbar array in accordance with the present disclosure.

Four-Tile Row-Wise Crossbar Array

Figure 6:
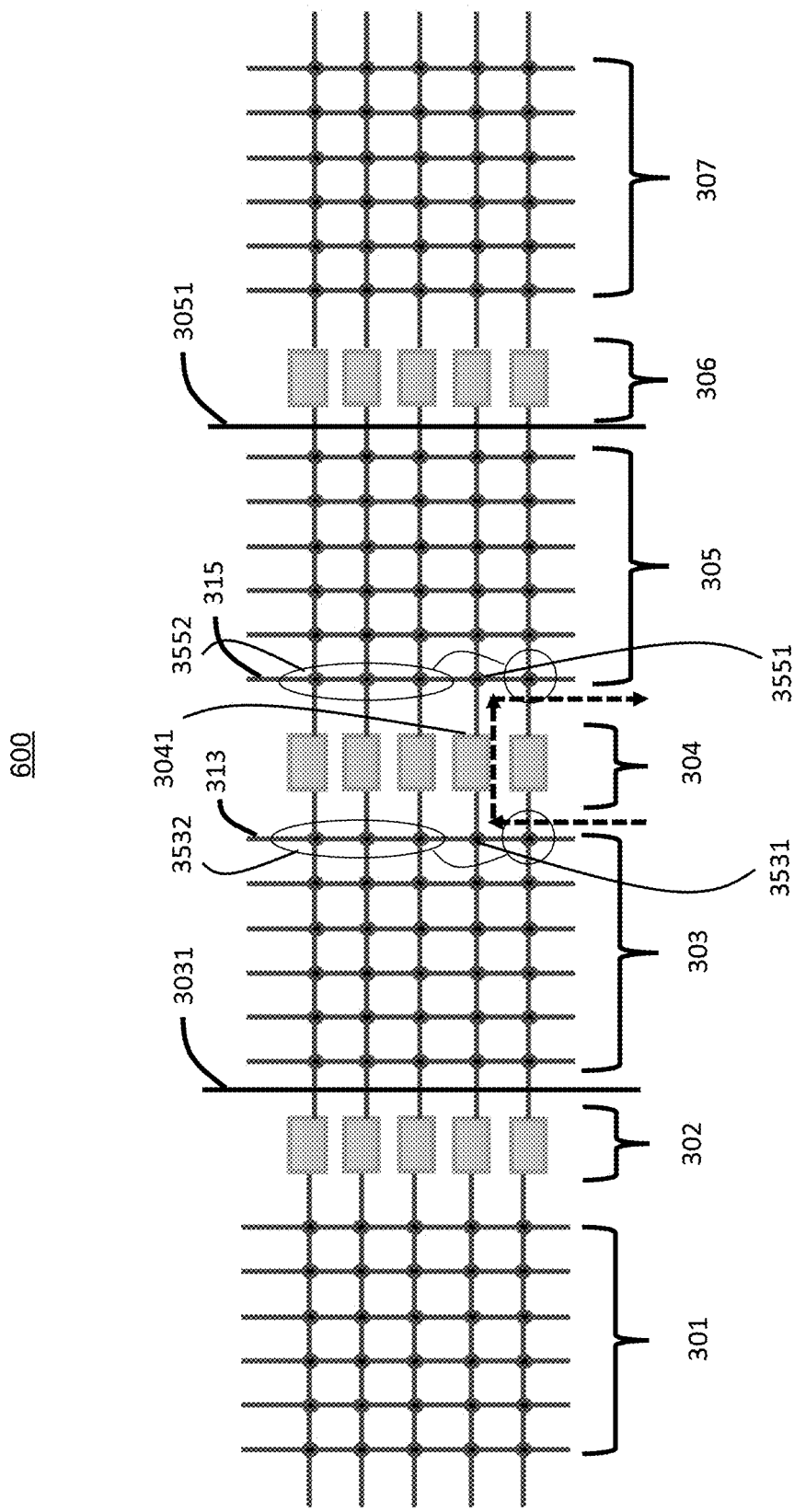
FIG. 6 is a block diagram illustrating an example four-tile crossbar array with row-wise access transistors in accordance with some implementations.

FIG. 6 is a block diagram illustrating an example four-tile row-wise crossbar array 600 in accordance with some implementations.

As shown in FIG. 6, the four-tile crossbar array 600 includes a first tile crossbar array 301, a second tile crossbar array 303, a third tile crossbar array 305, a four-tile crossbar array 307, a first flow controller array 302, a second flow controller array 304, a third flow controller array 306, a first common ground line 3031, and a second common ground line 3051 such that the first flow controller array 302 and the second flow controller array 304 are separated by the first common ground line 3031; and the second flow controller array 304 and the third flow controller array 306 are separated by the second common ground line 3051. In some implementations, the first and second common ground line 3031, 3051 are specially designed to electrically isolate different flow controller arrays and to achieve the advantage of independent programming of flow controller arrays.

In an example four-tile row-wise embodiment, the second tile crossbar array 303 includes a first cross-point device 3531 and a plurality of second cross-point devices 3532 on a first column wire 313; and the third tile crossbar array 305 includes a third cross-point device 3551 and a plurality of fourth cross-point devices 3552 on a second column wire 315. Since it is a row-wise embodiment, the first cross-point device 3531, the plurality of second cross-point devices 3532, the third cross-point device 3551, and the plurality of fourth cross-point devices 3552 are row-wise. It is noted that row-wise means the current may only pass through the cross-point devices in row direction when the state of the access transistor is ON. Therefore, to independently program the flow controller arrays in the four-tile row-wise embodiment, a programming path for flow controllers may be found by pre-programming the cross-point devices 3531 and 3551 which are on both ends of the flow controller 3041 to ON state, and then program the state of the flow controller 3041. The rest of the other flow controller arrays such as 302 and 306 will not be affected due to the common ground line 3031 and 3051.

Four-Tile Column-Wise Crossbar Array

Figure 7:
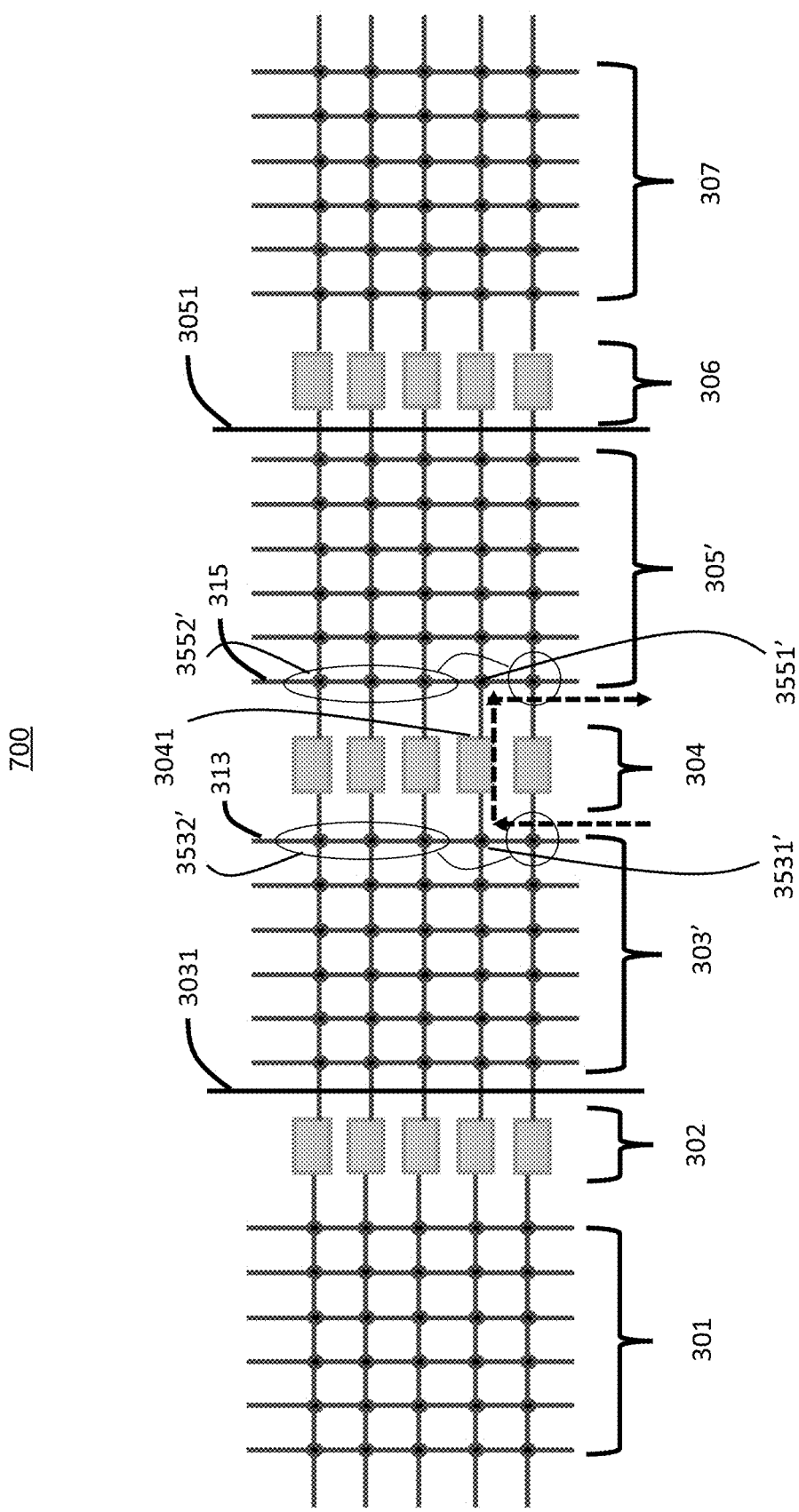
FIG. 7 is a block diagram illustrating an example four-tile crossbar array with column-wise access transistors in accordance with some implementations.

FIG. 7 is a block diagram illustrating an example four-tile column-wise crossbar array 700 in accordance with some implementations.

As shown in FIG. 7, the four-tile crossbar array 700 includes the first tile crossbar array 301, a second tile crossbar array 303', a third tile crossbar array 305', the four-tile crossbar array 307, the first flow controller array 302, the second flow controller array 304, the third flow controller array 306, the first common ground line 3031, and the second common ground line 3051 such that the first flow controller array 302 and the second flow controller array 304 are separated by the first common ground line 3031; and the second flow controller array 304 and the third flow controller array 306 are separated by the second common ground line 3051. In some implementations, the first and second common ground line 3031, 3051 are specially designed to electrically isolate different flow controller arrays and to achieve the advantage of independent programming of flow controller arrays.

In an example four-tile column-wise embodiment, the second tile crossbar array 303' includes a first cross-point device 3531' and a plurality of second cross-point devices 3532' on the first column wire 313; and the third tile crossbar array 305' includes a third cross-point device 3551' and a plurality of fourth cross-point devices 3552' on the second column wire 315. Since it is a column-wise embodiment, the first cross-point device 3531', the plurality of second cross-point devices 3532', the third cross-point device 3551', and the plurality of fourth cross-point devices 3552' are column-wise. It is noted that column-wise means the current may only pass through the cross-point devices in column direction when the state of the access transistor is ON. Therefore, to independently program the flow controller arrays in the four-tile column-wise embodiment, in addition to pre-programming the cross-point devices 3531' and 3551' which are on both ends of the flow controller 3041 to ON state, we also need to program other cross-point devices 3532', 3552' on the same column to be OFF state and then program the state of the flow controller 3041. The rest of the other flow controller arrays such as 302, 306 and will not be affected due to the common ground line 3031 and 3051. Also, the rest of the flow controllers in the same flow controller array 304 other than the flow controller 3041 will not be affected due to the OFF state of the cross-point devices 3532' and 3552'.

Twelve-Tile Crossbar Array

Figure 8A:
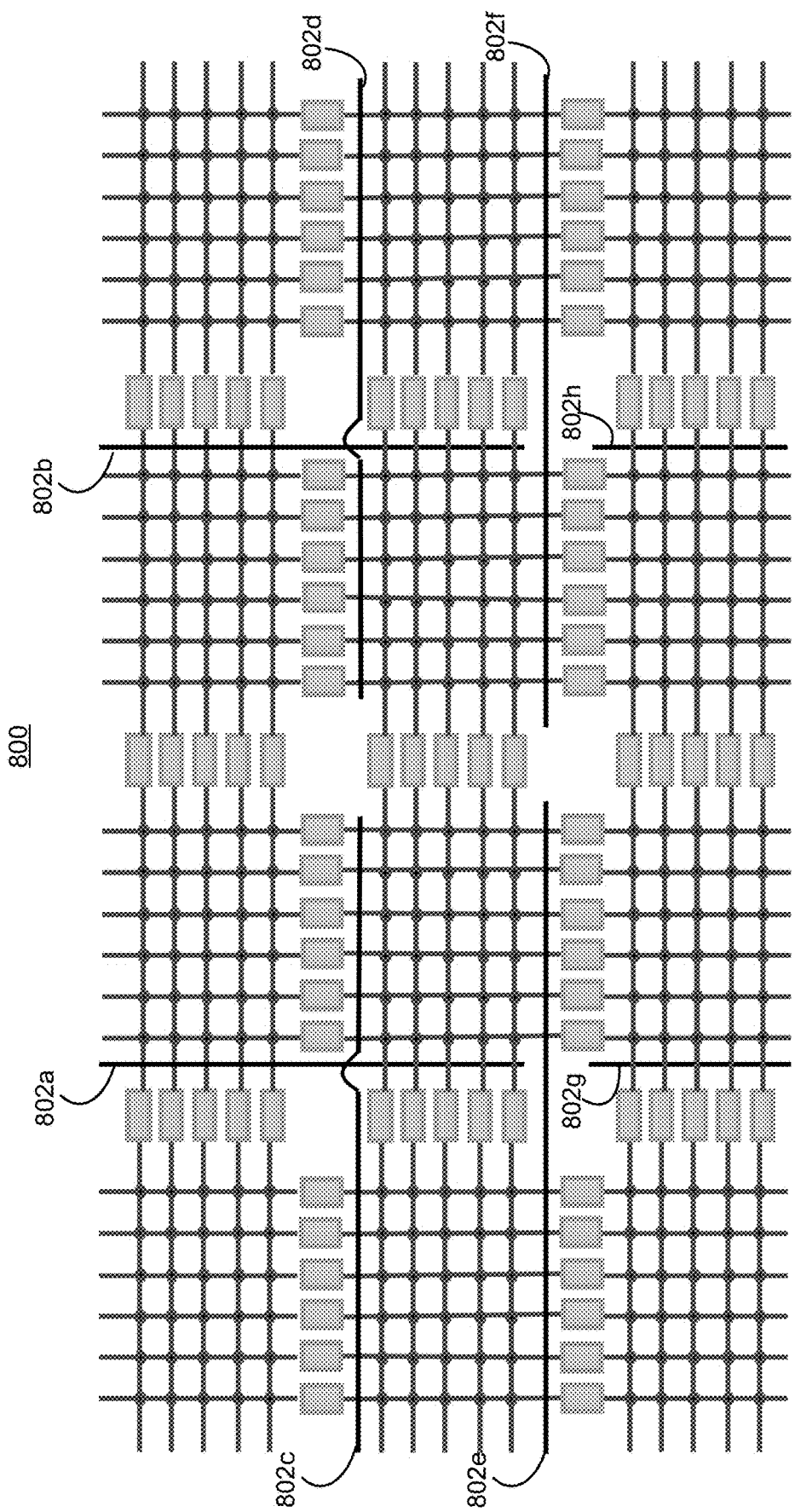
FIG. 8A is a block diagram illustrating an example twelve-tile crossbar array in accordance with some implementations.

FIG. 8A is a block diagram illustrating an example twelve-tile crossbar array 800 in accordance with some implementations. In FIG. 8A, by pre-programming the cross-point devices to ON state on both ends of the target flow controller, and pre-programming the cross-point devices to OFF state on both ends of other flow controllers on the same column, all the flow controllers exist a programming path by using the common ground lines.

3D structure of A Crossbar Array

As illustrated in the FIG. 8A, by utilizing the position of the common ground lines (e.g., 802a, 802b, 802c, 802d, 802e, 802f, 802g, and 802h), flow controllers may be individually programmed and thus independent from each other.

Figure 8B:
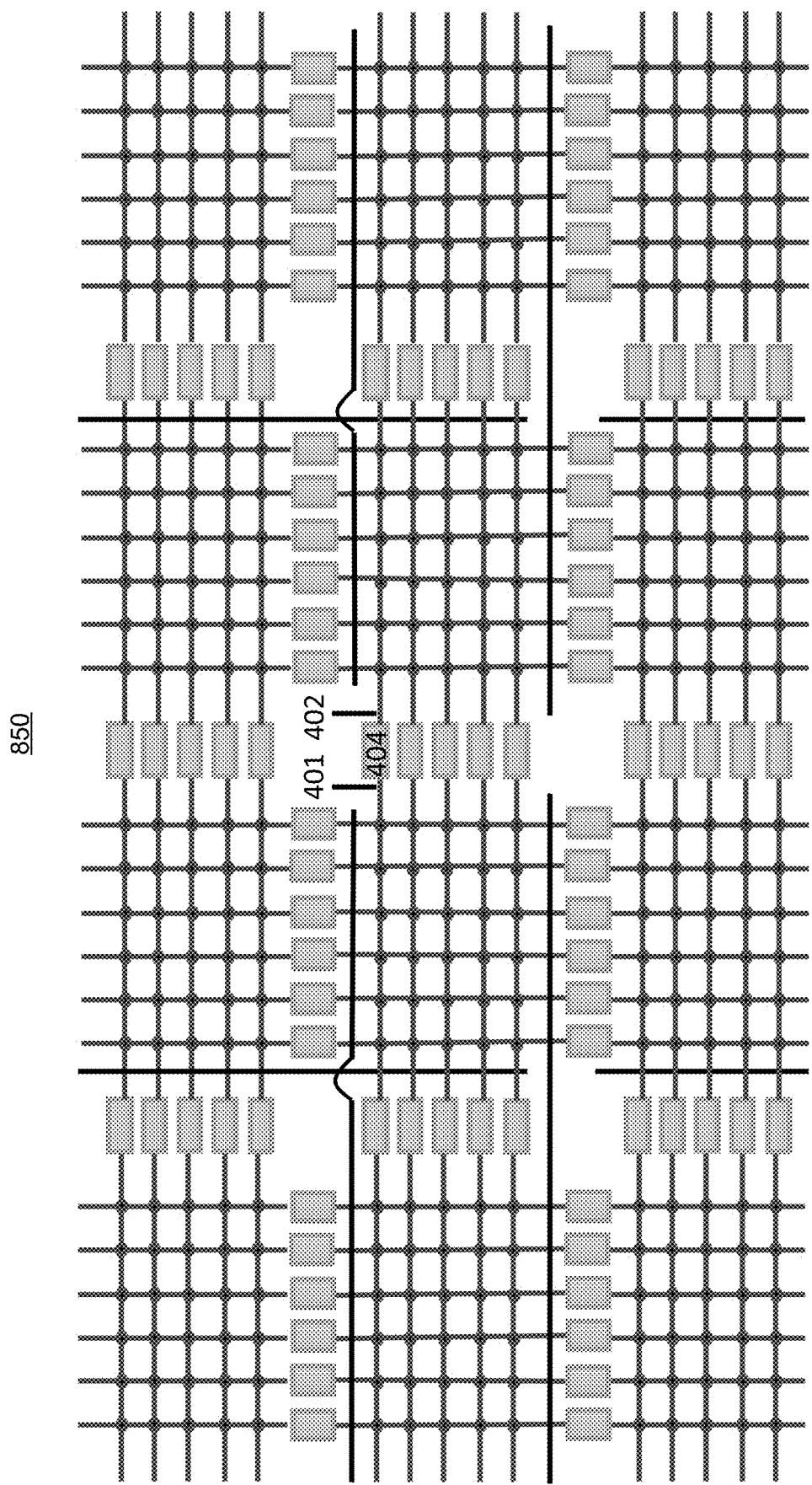
FIG. 8B is a block diagram illustrating an example twelve-tile crossbar array in accordance with some implementations.

In some crossbar circuit designs, however, utilizing the common ground lines alone does not enable flow controllers in a crossbar array 850 to be independently controlled. Therefore, as illustrated in FIG. 8B, when a programming path does not exist for independently programming the flow controller 404 without affecting other flow controllers, different metal layers (such as the first metal layer 401 and the second metal layer 402) may be connected to two ends of the flow controller to connect to input or output signal sources. This is an alternative 3D structure design when a more complex crossbar array circuit is arranged. When applying above embodiments of the crossbar array circuit in a neural network, examples of convolution operation are discussed with references to at least FIGS. 9-11.

Figure 9:
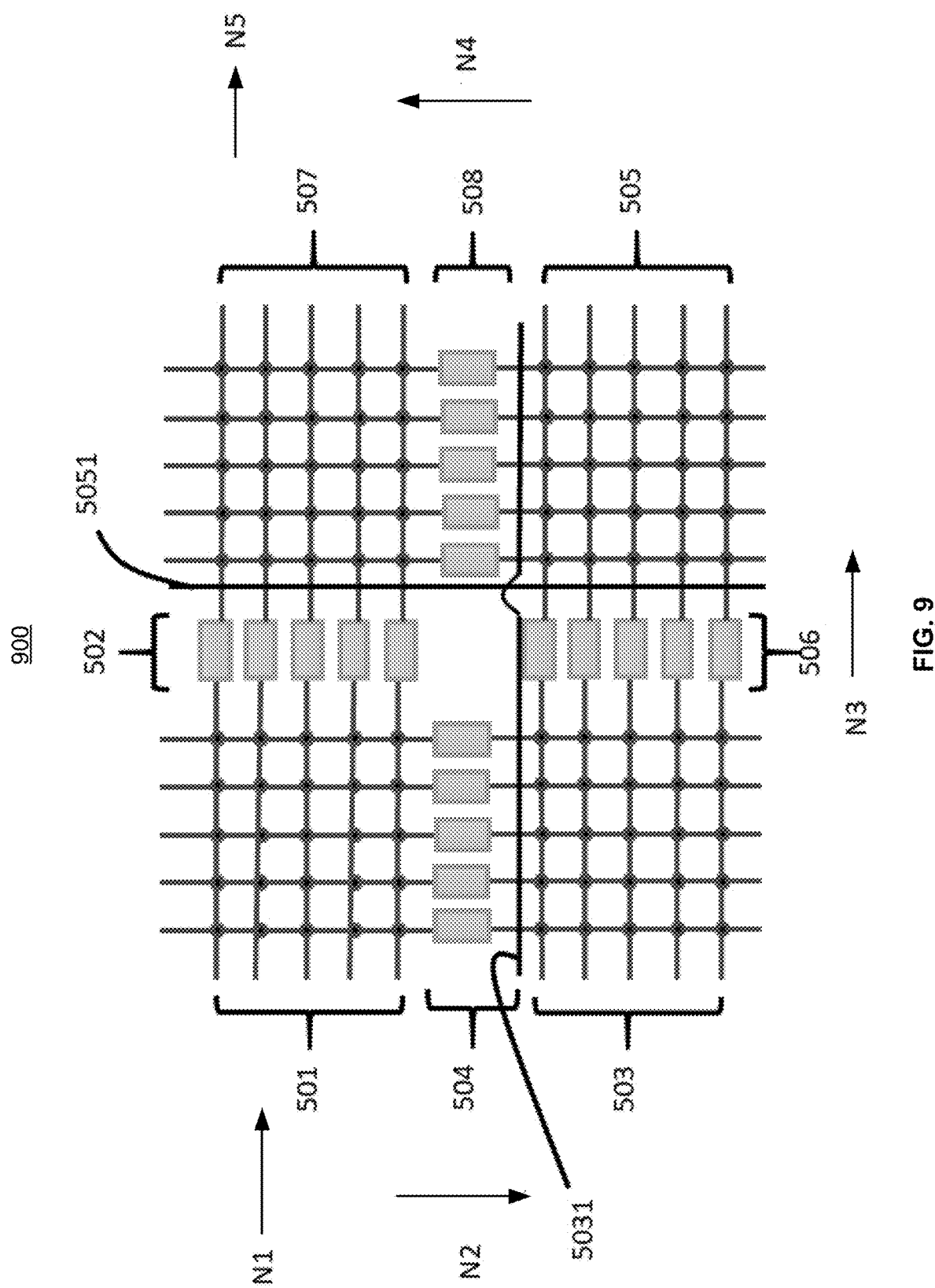
FIG. 9 is a block diagram illustrating an example five-layer neural network in accordance with some implementations.

FIG. 9 is a block diagram illustrating an example five-layer neural network 900 in accordance with some implementations. The 5-layer neural network in a crossbar circuit 900 includes a first tile crossbar array 501, a second tile crossbar array 503, a third tile crossbar array 505, a fourth tile crossbar array 507, a first flow controller array 502, a second flow controller array 504, a third flow controller array 506, a fourth flow controller array 508, a first common ground line 5031, and a second common ground line 5051. The first common ground line 5031 separates the second flow controller array 504 and the third flow controller array 506, and/or the third flow controller array 506 and the fourth flow controller array 508. The second common ground line 5051 separates the third flow controller array 506 and the fourth flow controller array 508, and/or the first flow controller array 502 and the fourth flow controller array 508. Therefore, all the flow controllers in the 5-layer neural network in the crossbar array will be independent of each other. An individually programming feature is achieved.

Before an input data of a first matrix n1 is inserted into the first tile crossbar array 501, the first flow controller array 502 is pre-programmed all OFF, a second weighted matrix n2 is pre-programmed in the second flow controller array 504, a third weighted matrix n3 is pre-programmed in the third flow controller array 506, and a fourth weighted matrix n4 is pre-programmed in the third flow controller array 508. Therefore, when it outputs the data of a fifth matrix n5, an n1→n2→n3→n4→n5 neural network is achieved. In these implementations, it is assumed that the tiles crossbar arrays are large enough to handle the size of a matrix. If not, partition techniques may be used.

Figure 10:
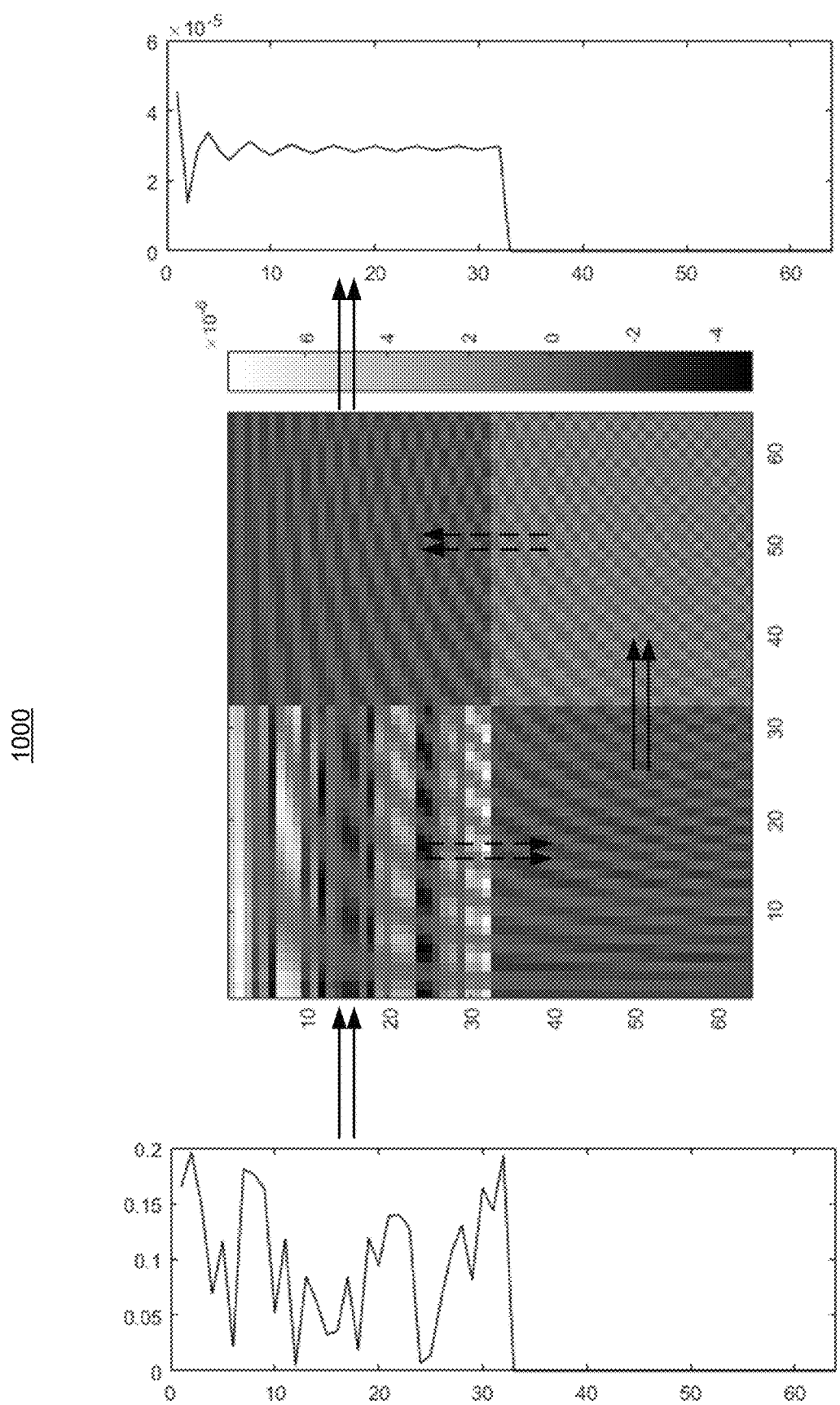
FIG. 10 is a block diagram illustrating an example simulation result produced by the five-layer neural network shown in FIG. 9.

FIG. 10 is a block diagram illustrating an example simulation result 1000 produced by the five-layer neural network shown in FIG. 9.

The simulation result 1000 shows controlled current flow of four 16×16 tiles in a 32×32 crossbar array, implementing a 5-layer neural network in one crossbar array. In some implementations, different cross-point devices and wires may have different resistances, affecting the current flow; the resistance difference may be compensated by compensating the input signal corresponding to the simulation result to reduce disturbance caused by the different levels of resistance within different devices. The arrows with solid lines, in FIG. 10, represent row-wise current flows; and the arrows with broken lines represent column-wise current flows.

Figure 11:
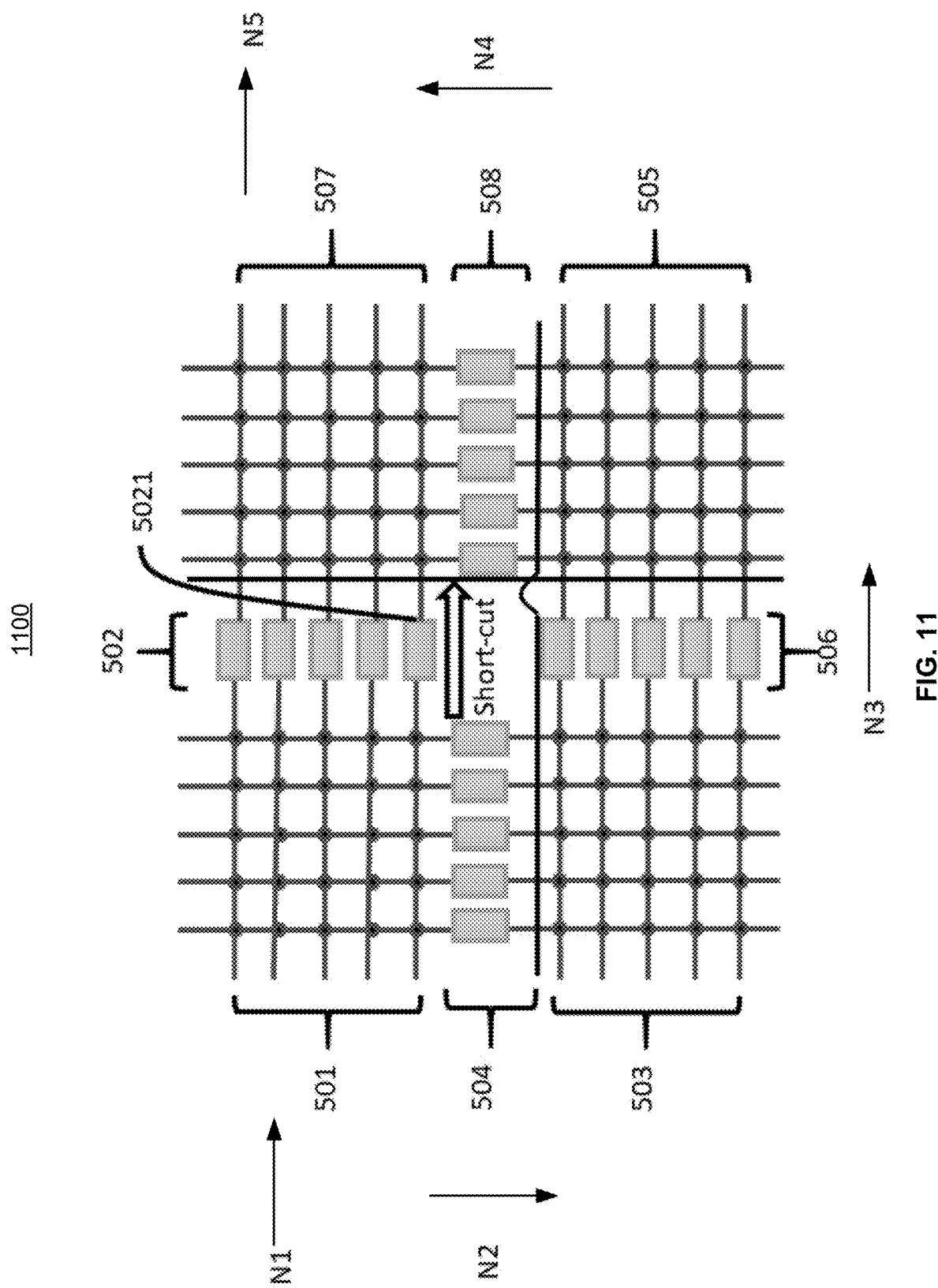
FIG. 11 is a block diagram illustrating an example five-layer neural network in accordance with some implementations.

FIG. 11 is a block diagram illustrating an example five-layer neural network 1100 with a shortcut route feature in accordance with some implementations.

The five-layer neural network 1100 is similar to the neural network 900 shown in FIG. 9, but with an additional short-cut feature. Some neural networks, for example, a Residual Network (ResNet), require the existence of a short-cut within that network. The short-cut is required so that output result from one layer may be delivered to not only the adjacent layer, but to non-adjacent layers. For example, as shown in FIG. 11, when the state of the last flow controller 5021 within the first flow controller array 502 is switched to ON, output result from the first layer (n1) may be directly passed to the fifth layer (n5).

FIG. 12 is a flowchart illustrating an example method 1200 for implementing a multi-layer neural network using crossbar arrays in accordance with some implementations. The computer-implemented method 1200 may be used to manufacture at least the crossbar arrays shown with references to FIGS. 3-9. The computer system 1300, when properly programmed, can execute the method 1200.

In some implementations, the method 1200 includes: preparing (1202) an input signal to an apparatus. The apparatus (1204) includes: a plurality of first devices, a plurality of second devices, a plurality of third devices, a plurality of fourth devices, a plurality of first flow controllers connecting the plurality of first devices and the plurality of second devices, a plurality of second flow controllers connecting the plurality of second devices and the plurality of third devices, and a plurality of third flow controllers connecting the plurality of the third devices and the plurality of the fourth devices.

In some implementations, the method 1200 further includes: selecting (1206) one flow controller in the plurality of second flow controllers as a selected second flow controller; turning (1208) to ON state of one of the plurality of second devices and one of the pluralities of third devices that are in two ends of the selected second flow controller; and programming (1210) the selected second flow controller. The plurality of second devices and the plurality of third devices are row-wise devices.

Figure 13:
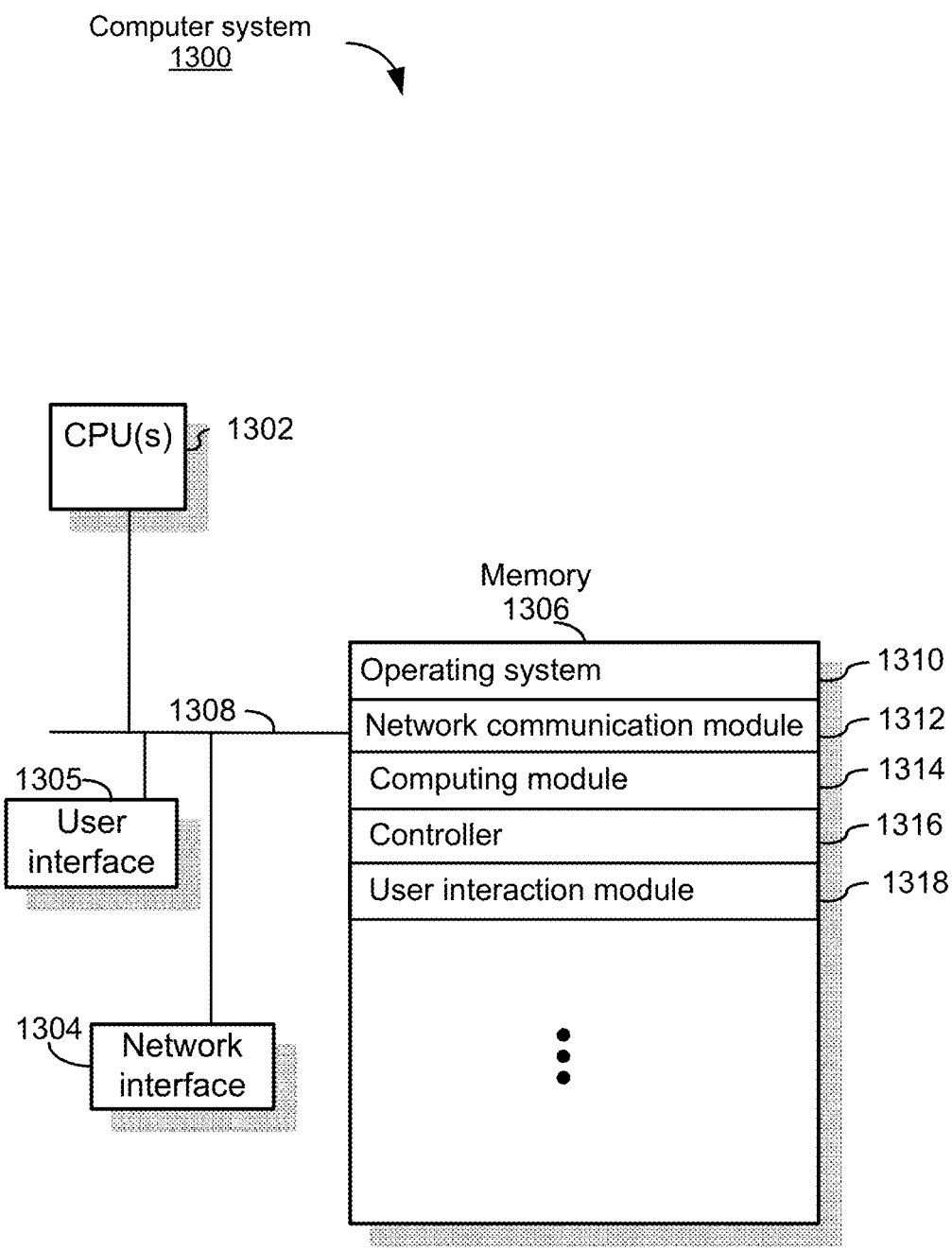
FIG. 13 is a block diagram illustrating an example computing system for implementing a multi-layer neural network using crossbar arrays in accordance with some implementations.

FIG. 13 is a block diagram illustrating an example computing system 1300 for implementing a multi-layer neural network using crossbar arrays in accordance with some implementations. The computer system 1300 may be used to at least the crossbars or crossbar arrays shown with references to FIGS. 1 and 11. The computer system 1300 in some implementations includes one or more processing units CPU(s) 1302 (also referred to as processors), one or more network interfaces, optionally a user interface, a memory 1306, and one or more communication buses 1310 for interconnecting these components. The communication buses 1310 optionally include circuitry (sometimes called a chipset) that interconnects and controls communications between system components. The memory 1306 typically includes high-speed random access memory, such as DRAM, SRAM, DDR RAM or other random access solid state memory devices; and optionally includes non-volatile memory, such as one or more magnetic disk storage devices, optical disk storage devices, flash memory devices, or other non-volatile solid state storage devices. The memory 1306 optionally includes one or more storage devices remotely located from the CPU(s) 100. The memory 1306, or alternatively the non-volatile memory device(s) within the memory 1306, comprises a non-transitory computer readable storage medium. In some implementations, the memory 1306 or alternatively the non-transitory computer readable storage medium stores the following programs, modules and data structures, or a subset thereof:

- an operating system 1310 (e.g., an embedded Linux operating system), which includes procedures for handling various basic system services and for performing hardware dependent tasks;
- a network communication module 1312 for connecting the computer system with a manufacturing machine via one or more network interfaces (wired or wireless);
- a computing module 1314 for executing programming instructions;
- a controller 1316 for controlling a manufacturing machine in accordance with the execution of programming instructions; and
- a user interaction module 13113 for enabling a user to interact with the computer system 1300.

One or more of the above identified elements may be stored in one or more of the previously mentioned memory devices, and correspond to a set of instructions for performing a function described above. The above identified modules or programs (e.g., sets of instructions) need not be implemented as separate software programs, procedures or modules, and thus various subsets of these modules may be combined or otherwise re-arranged in various implementations. In some implementations, the memory 1306 optionally stores a subset of the modules and data structures identified above. Furthermore, the memory 1306 may store additional modules and data structures not described above.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
a plurality of first cross-point devices;
a plurality of second cross-point devices; and
a plurality of first flow controllers connecting the plurality of first cross-point devices and the plurality of second cross-point devices, wherein each flow controller in the plurality of first flow controllers is independently controlled from other flow controllers in the plurality of first flow controllers, and wherein the plurality of first flow controllers controls current flows passing through the plurality of first cross-point devices and the plurality of second cross-point devices.

2. The apparatus as claimed in claim 1, wherein the plurality of first cross-point devices and the plurality of second cross-point devices comprise devices with tunable resistance, and wherein the devices with tunable resistance comprise at least one of: a memristor device, a memristive device, a floating gate, a Phase Change Random Access Memory (PCRAM) device, a Resistive Random-Access Memory (RRAM or ReRAM), a Magnetoresistive Random-Access Memory (MRAM), a Dynamic random-access memory (DRAM), or a Static Random-Access Memory (static RAM or SRAM).

3. The apparatus as claimed in claim 1, further comprising:
a plurality of third cross-point devices;
a plurality of second flow controllers connecting the plurality of second cross-point devices and the plurality of third cross-point devices, wherein the plurality of second flow controllers controls current flows passing through the plurality of second cross-point devices and the plurality of third cross-point devices; and
a first common ground line separating the plurality of first flow controllers and the plurality of second flow controllers, wherein each of the plurality of second flow controllers is independent of each of the plurality of first flow controllers.

4. The apparatus as claimed in claim 3, further comprising:
a plurality of fourth cross-point devices;
a plurality of third flow controllers connecting the plurality of third cross-point devices and the plurality of fourth cross-point devices, wherein the plurality of third flow controllers controls current flows passing through the plurality of third cross-point devices and the plurality of fourth cross-point devices; and
a second common ground line separating the plurality of second flow controllers and the plurality of third flow controllers, wherein each of the plurality of third flow controllers is independent of each of the plurality of second flow controllers.

5. The apparatus as claimed in claim 4, further comprising:
a plurality of first metal layers;
a plurality of second metal layers; and
a signal source connecting to the plurality of first metal layers and the plurality of second metal layers, wherein the plurality of first metal layers and the plurality of second metal layers are formed in two ends of the plurality of second flow controllers.

6. A method comprising:
preparing an input signal to an apparatus, wherein the apparatus includes:
a plurality of first cross-point devices,
a plurality of second cross-point devices,
a plurality of third cross-point devices,
a plurality of fourth cross-point devices,
a plurality of first flow controllers connecting the plurality of first cross-point devices and the plurality of second cross-point devices,
a plurality of second flow controllers connecting the plurality of second cross-point devices and the plurality of third cross-point devices, and
a plurality of third flow controllers connecting the plurality of the third cross-point devices and the plurality of the fourth cross-point devices;
selecting one flow controller in the plurality of second flow controllers as a selected second flow controller;
forming a programming path for programming the selected second flow controller, comprising:
turning to ON state of one of the plurality of second cross-point devices and one of the plurality of third cross-point devices that are connected to a first end and a second end of the selected second flow controller, respectively; and
programming the selected second flow controller, wherein the plurality of second cross-point devices and the plurality of third cross-point devices are row-wise devices.

7. The method as claimed in claim 6, wherein the plurality of first cross-point devices and the plurality of second cross-point devices comprise devices with tunable resistance, and wherein the devices with tunable resistance comprise at least one of: a memristor device, a memristive device, a floating gate, a Phase Change Random Access Memory (PCRAM) device, a Resistive Random-Access Memory (RRAM or ReRAM), a Magnetoresistive Random-Access Memory (MRAM), a Dynamic random-access memory (DRAM), or a Static Random-Access Memory (static RAM or SRAM).

8. An apparatus comprising:
a plurality of first cross-point devices;
a plurality of second cross-point devices;
a plurality of third cross-point devices;
a plurality of fourth cross-point devices;
a plurality of first flow controllers connecting the plurality of first cross-point devices and the plurality of second cross-point devices, wherein the plurality of first flow controllers controls current flows passing through the plurality of first cross-point devices and the plurality of second cross-point devices;
a plurality of second flow controllers connecting the plurality of second cross-point devices and the plurality of third cross-point devices, wherein the plurality of second flow controllers controls current flows passing through the plurality of second cross-point devices and the plurality of third cross-point devices;
a plurality of third flow controllers connecting the plurality of third cross-point devices and the plurality of fourth cross-point devices, wherein the plurality of third flow controllers controls current flows passing through the plurality of third cross-point devices and the plurality of fourth cross-point devices; and
a plurality of fourth flow controllers connecting the plurality of fourth cross-point devices and the plurality of first cross-point devices, wherein the plurality of fourth flow controllers controls current flows passing through the plurality of first cross-point devices and the plurality of fourth cross-point devices, and wherein each of the plurality of first flow controllers, the plurality of second flow controllers, the plurality of third flow controllers, and the plurality of fourth flow controllers is independent from others.

9. The apparatus as claimed in claim 8, further comprising:
a first common ground line; and
a second common ground line, wherein the first common ground line separates the plurality of second flow controllers and the plurality of third flow controllers, and/or the plurality of third flow controllers and the plurality of fourth flow controllers.

10. The apparatus as claimed in claim 9, wherein the second common ground line separates the plurality of second flow controllers and the plurality of third flow controllers, and/or the plurality of first flow controllers and the plurality of fourth flow controllers.

11. The apparatus as claimed in claim 1, wherein an output of the plurality of first cross-point devices is passed to the plurality of second cross-point devices.

12. The method of claim 6, wherein forming the programming path for programming the selected second flow controller further comprises:
preprogramming one or more of the second cross-point devices and the third cross-point devices to an OFF state via one or more common ground lines, wherein the one or more of the second cross-point devices and the third cross-point devices are connected to the second flow controllers that are not selected for programming.

13. The method of claim 6, further comprising:
outputting, via the plurality of fourth cross-point devices, data representative of an output result of a multi-layer neural network.

14. The method of claim 13, further comprising:
passing a first output of the plurality of first cross-point devices to the plurality of second cross-point devices, wherein the first output of the plurality of first cross-point devices represents a first output result of a first layer of the multi-layer neural network; and
passing a second output of the plurality of second cross-point devices to the plurality of third cross-point devices, wherein the second output of the plurality of second cross-point devices represents a second output result of a second layer of the multi-layer neural network.

15. The apparatus as claimed in claim 8, wherein an output of the plurality of first cross-point devices is passed to the plurality of second cross-point devices.

16. The apparatus as claimed in claim 8, wherein an output of the plurality of first cross-point devices is passed to the plurality of fourth cross-point devices.

* * * * *